United States Patent
Schmatz

(10) Patent No.: US 10,637,425 B2
(45) Date of Patent: Apr. 28, 2020

(54) METHOD AND ARRANGEMENT FOR CONTROLLING AN OUTPUT VOLUME OF AT LEAST ONE ACOUSTIC OUTPUT DEVICE

(71) Applicant: SIEMENS MOBILITY GMBH, Munich (DE)

(72) Inventor: Klaus-Dieter Schmatz, Erlangen (DE)

(73) Assignee: Siemens Mobility GmbH, Munich (DE)

(*) Notice: Subject to any disclaimer, the term of this patent is extended or adjusted under 35 U.S.C. 154(b) by 0 days.

(21) Appl. No.: 16/089,678

(22) PCT Filed: Mar. 9, 2017

(86) PCT No.: PCT/EP2017/055520
§ 371 (c)(1),
(2) Date: Sep. 28, 2018

(87) PCT Pub. No.: WO2017/167562
PCT Pub. Date: Oct. 5, 2017

(65) Prior Publication Data
US 2019/0123703 A1   Apr. 25, 2019

(30) Foreign Application Priority Data
Mar. 30, 2016  (DE) .................. 10 2016 205 184

(51) Int. Cl.
*H04R 3/12*   (2006.01)
*H04R 3/02*   (2006.01)
(Continued)

(52) U.S. Cl.
CPC ........... *H03G 7/002* (2013.01); *H03G 3/3005* (2013.01); *H04R 3/12* (2013.01); *H04R 29/002* (2013.01);
(Continued)

(58) Field of Classification Search
CPC .. H03G 3/3005; H03G 7/002; H04R 2499/13; H04R 27/00; H04R 29/002; H04R 3/02; H04R 3/12
(Continued)

(56) References Cited

U.S. PATENT DOCUMENTS 4,691,202 A    9/1987  Denne et al.
5,721,783 A *  2/1998  Anderson ............... H04B 1/385
                                                    381/328
(Continued)

FOREIGN PATENT DOCUMENTS

DE      102008010702 A1   8/2009
EP           0161779 B1    7/1991
(Continued)

*Primary Examiner* — Paul Kim
*Assistant Examiner* — Friedrich Fahnert
(74) *Attorney, Agent, or Firm* — Laurence Greenberg; Werner Stemer; Ralph Locher

(57) ABSTRACT

A method for controlling the output volume of at least one acoustic output device includes recording an acoustic voice signal using a speech recording device, and outputting the acoustic voice signal using the at least one output device. The location of the speech recording device relative to the at least one output device is determined and the output volume of the at least one output device is controlled as a function of the location. An arrangement for controlling the output volume of at least one acoustic output device is also provided.

14 Claims, 2 Drawing Sheets

(51) Int. Cl.
  *H04R 27/00* (2006.01)
  *H03G 7/00* (2006.01)
  *H03G 3/30* (2006.01)
  *H04R 29/00* (2006.01)
(52) U.S. Cl.
  CPC ............... *H04R 3/02* (2013.01); *H04R 27/00* (2013.01); *H04R 2499/13* (2013.01)
(58) Field of Classification Search
  USPC ........ 381/57, 80, 82, 312, 316, 328; 455/95, 455/114.2, 187.1, 450, 456.1, 509
  See application file for complete search history.

(56) References Cited

U.S. PATENT DOCUMENTS

| | | | |
|---|---|---|---|
| 6,952,471 B1 | 10/2005 | Cannon et al. | |
| 8,976,986 B2 | 3/2015 | Angeloff et al. | |
| 2005/0083181 A1 | 4/2005 | Jalkanen et al. | |
| 2005/0129254 A1 | 6/2005 | Connor et al. | |
| 2005/0176442 A1 | 8/2005 | Ju et al. | |
| 2006/0165245 A1 | 7/2006 | Niehoff et al. | |
| 2007/0058820 A1 | 3/2007 | Sawara et al. | |
| 2007/0117580 A1* | 5/2007 | Fehr | H03J 1/0075 455/509 |
| 2007/0298743 A1* | 12/2007 | Chung | H04B 5/0062 455/187.1 |
| 2010/0022205 A1* | 1/2010 | Henry | H04R 3/00 455/95 |
| 2010/0195505 A1* | 8/2010 | Cheng | H04W 84/18 370/241 |
| 2011/0138183 A1* | 6/2011 | Reddy | H04K 3/25 713/169 |
| 2012/0051561 A1 | 3/2012 | Cohen et al. | |
| 2012/0264454 A1 | 10/2012 | Agardh et al. | |
| 2013/0029685 A1 | 1/2013 | Moshfeghi | |
| 2013/0101134 A1* | 4/2013 | Betts-Lacroix | H04S 7/30 381/80 |
| 2014/0064501 A1 | 3/2014 | Olsen et al. | |
| 2017/0245078 A1* | 8/2017 | Hegde | H04W 4/029 |
| 2018/0286276 A1* | 10/2018 | Lee | G06F 3/011 |

FOREIGN PATENT DOCUMENTS

| | | | |
|---|---|---|---|
| EP | 1687750 B1 | | 6/2008 |
| JP | H0684500 | * | 12/1994 |
| JP | H0684500 U | | 12/1994 |
| JP | 2000261895 A | | 9/2000 |
| JP | 2004032463 A | | 1/2004 |
| JP | 2006324999 A | * | 11/2006 |
| KR | 101077879 B1 | | 10/2011 |
| RU | 2553432 C2 | | 6/2015 |
| WO | 2012045347 A1 | | 4/2012 |

\* cited by examiner

METHOD AND ARRANGEMENT FOR CONTROLLING AN OUTPUT VOLUME OF AT LEAST ONE ACOUSTIC OUTPUT DEVICE

BACKGROUND OF THE INVENTION

Field of the Invention

The invention relates to a method for controlling an output volume of at least one acoustic output device comprising: recording an acoustic voice signal using a speech-recording device, and outputting the acoustic voice signal using the at least one output device.

The recording and reproducing of acoustic voice signals in open and closed spatial areas find application in various technical fields. Examples are amplifying singing at live concerts and also announcements at airports, stations, etc. For instance, to impart information to people who are in a spatial area, announcement systems are used in which an announcer makes an announcement and the announcement is output acoustically using output devices in the spatial area. In particular, when operating rail vehicles in public transport, announcements are activated by train conductors in order to inform passengers of the further progression of the journey or of forthcoming stops, for example.

Announcement systems with a train conductor announcement point that is arranged in a fixed location in a rail vehicle, by means of which point announcements can be activated, are known. The announcement is played on speakers in the rail vehicle while it is being spoken. The speakers are arranged at various places in the vehicle such that passengers can detect the announcement acoustically. These announcement systems lack flexibility when used since the train conductor has to move to one of the train conductor announcement points arranged at a fixed location in the rail vehicle for each announcement. To do this, other activities, such as checking tickets, for example, have to be interrupted.

SUMMARY OF THE INVENTION

Against this background, the object underlying the invention is to provide a method in which the recording and outputting of the acoustic voice signal can be handled in a particularly simple and flexible manner.

The above problem is solved by a method of the type mentioned in the introduction, which comprises the steps:

determining a location of the speech-recording device relative to the at least one output device, the output volume of the at least one output device being controlled according to the location.

In the context of the present invention, output volume is to be understood as an intensity of the acoustic voice signal that is output by the output device.

The recording of the acoustic voice signal by means of the speech-recording device preferably comprises conversion of the acoustic voice signal into an electromagnetic voice signal. The speech-recording device is preferably connected to the output device by means of signal technology, such that the electromagnetic voice signal can be transmitted to the output device. The outputting of the acoustic voice signal preferably comprises conversion of the electromagnetic voice signal into an amplified acoustic voice signal that can be detected by people in the area surrounding the output device.

The at least one output device is preferably arranged within a spatial area. More preferably, the location of the respective output device within the spatial area is known. As a result thereof, the location of the speech-recording device relative to the output device can be determined by determining the location of the speech-recording device within the spatial area.

Controlling preferably comprises lowering and/or increasing the output volume. When controlling the output volume of the at least one output device as a function of the location, an alignment of the output device is preferably taken into account. A person skilled in the art understands alignment of the output device as meaning the direction in which the acoustic voice signal is output using the output device.

In the invention it has been acknowledged that with previous solutions in which announcements are activated using mobile speech-recording devices, an announcement is first recorded and is only played by output devices after completion of the recording. In particular, with recordings that take a long time, this leads to uncomfortable handling for a person activating the announcement.

According to a preferred embodiment of the invention, the output device is an output device in a vehicle, in particular in a rail vehicle. In particular, when operating vehicles in public transport, it is desirable for the on-board team to activate announcements to impart information to passengers. Here, it needs to be taken into account that, particularly in the case of vehicles, the spatial conditions are such that a distance between the speech-recording device and the output device may be relatively small. Control of the output volume as a function of the location of the speech-recording device in vehicles is consequently useful and advantageous.

According to a further preferred embodiment of the invention, the output volume is controlled such that acoustic feedback between the at least one output device and the speech-recording device is avoided. Acoustic feedback can preferably be avoided by the volume of at least one output device that is oriented in the direction of the speech-recording device being reduced.

In a further preferred embodiment of the invention, the location of the speech-recording device is determined based on at least one location-determination signal that emanates from an active and/or passive transponder element and which is received by the speech-recording device. The transponder element is preferably arranged in a spatial area that is intended for the outputting of the acoustic voice signal. More preferably, the transponder elements are arranged in the spatial area such that at least one location-determination signal is received at each location in the spatial area. A person skilled in the art understands the term "passive" such that the transponder element contains, for instance stores, location-determination information, and that it has to be actively read by means of a readout device, preferably a readout device pertaining to the speech-recording device, in order to receive the location-determination signal that contains the location-determination information. The use of a passive transponder element has the advantage that no energy supply has to be provided for the respective passive transponder element. A person skilled in the art understands the term "active" such that the transponder element actively transmits the location-determination signal. The use of an active transponder element has the advantage that no readout device is required for the active readout of the transponder element. The speech-recording device then preferably comprises a receiving unit for receiving the location-determination signal output by the active transponder element. More preferably, the active transponder element transmits the location-determination signal at regular time intervals.

According to a preferred further development of the invention, the speech-recording device receives the location-determination signal in the form of an electromagnetic signal using the Bluetooth standard. By using the Bluetooth standard, a simple implementation of the outputting and receiving and of the further evaluation of the location-determination signal can be determined. At the same time, standardized routines can be used for the desired function.

According to a further preferred development of the invention, the passive transponder element comprises an RFID element, and/or the active transponder element comprises a beacon element. To read out the RFID (Radio-Frequency Identification) element, an alternating electromagnetic field can be induced in the RFID element and can be modulated by an antenna element of the RFID element. Using the modulated alternating electromagnetic field that emanates from the RFID element, the speech-recording unit is in a position to identify the RFID element. The beacon element preferably transmits the location-determination signal using the Bluetooth Low Energy standard, and more preferably using the iBeacon standard. In this way, an energy-efficient operation of the beacon element can be achieved. In addition, recourse can be made to standard, pre-defined properties of the location-determination signal and a simple implementation of the receiving and the further processing of the location-determination signal using the speech-recording device can be achieved.

In a further preferred exemplary embodiment of the invention, the location of the speech-recording device is determined on the basis of an intensity of the location-determination signal. The intensity of the location-determination signal preferably serves as additional information about the location-determination signal in order to determine the location of the speech-recording device. More preferably, a location of the transponder element from which the location-determination signal emanates is determined using the location-determination signal. The intensity of the location-determination signal preferably serves to determine the location of the speaker device relative to the transponder element. Both information items, that is, the location of the transponder element and also the location of the speech-recording device relative to the transponder element, can be used to determine the location of the speech-recording device relative to the output device, for example if the location of the output device is known.

According to a further preferred embodiment of the invention, the location-determination signal comprises an identification signal for identifying the transponder element. This represents a particularly useful and simple development of the location-determination signal. The identification signal preferably clearly identifies the transponder element globally. For this purpose, a clear identification signal is advantageously assigned to each transponder element for output. In an embodiment of the output device as an output device in a vehicle, a clear identification signal is preferably assigned to each transponder element within a fleet of vehicles run by an operator. A location of a transponder element that is arranged in a fixed location in the vehicle can be determined in this way using the identification signal.

The location-determination signal preferably comprises a plurality of identification signals. The location of the speech-recording device is more preferably determined on the basis of intensities of a plurality of identification signals that have been received. The location of the speech-recording device is preferably determined relative to the transponder element using triangulation. More preferably, the location of the speech-recording device relative to a longitudinal extent of a spatial area that is provided for the output of the acoustic speech-recording signal is determined. This has the advantage that the reception of two identification signals for the determination of the location of the speech-recording device is sufficient for the determination of the location of the speech-recording device relative to the two transponder elements.

In a preferred further development of the invention, an item of transponder location information is assigned to the identification signal using a mapping table that is representative of the location of the transponder element and the location of the speech-recording device is determined using the transponder location information. By means of a computing unit and/or the speech-recording device, on the basis of the identification signal, a request is preferably transmitted to a data processing device that provides the mapping table, and the transponder location information is provided in response to the request.

According to a further preferred further development of the invention, transponder location information is provided by a data processing device, which is arranged outside the transponder element. This is advantageous because it is possible to use simple transponder elements that are able to output the identification signal. In addition, the installation of an arrangement that performs the method according to the invention is simplified. If the transponder elements in fact are meant to output the transponder location information themselves, the individual transponder elements would then have to be programmed prior to installation in order to output the respective installation location as information. On the other hand, according to the further development, the provision of the transponder location information is moved into a preferably central data processing device, which is arranged outside the transponder element.

According to a further preferred exemplary embodiment of the invention, at least one ambient output device that is arranged in the ambient environment of the speech-recording device at a distance of less than 10 m from the speech-recording device is selected out of a plurality of output devices on the basis of the location, with the control of the output volume being achieved by controlling the output volume of the at least one ambient output device. In this way, a particularly simple implementation of the method according to the invention that avoids feedback is provided. More preferably, an ambient output device that is the shortest distance away from the speech-recording device is selected from a plurality of output devices.

According to a preferred further development of the invention, the control is an adjustment, in particular a switching off, of the output volume. The adjustment is preferably achieved by reducing the output volume of the ambient output device. When the output volume is switched off, feedback can be avoided in a particularly simple and reliable manner since the ambient output device does not emit the acoustic voice signal.

According to a preferred further development of the invention, the output devices each comprise at least one speaker unit and at least one amplifier unit, wherein at least one ambient amplifier unit that is arranged in the ambient environment of the speech-recording unit is selected from a plurality of amplifier units on the basis of the location and the control of the output volume is achieved by controlling the output of the at least one ambient amplifier unit. One of the plurality of amplifier units preferably serves to amplify the electric voice signal for a plurality of speaker signals. In other words, in each case, a plurality of speaker units are assigned to the respective amplifier units.

In a further preferred embodiment of the invention, the speech-recording device is a mobile terminal. The speech-recording device can therefore be transported by a person in order to carry out announcements. In the case of an embodiment of the output device as an output device in a rail vehicle, the speech-recording device is preferably a mobile terminal used by a train controller. The terminal preferably has further functions, for example mobile telephony. The user of the speech-recording device is thus capable of using an already existing mobile terminal to record the acoustic voice signal; transporting a speech-recording device as a separate unit is not required.

The invention further relates to an arrangement for controlling an output volume of at least one acoustic output device comprising a speech-recording device for recording an acoustic voice signal. The arrangement according to the invention is characterized by a determination unit for determining a location of the speech-recording device relative to the at least one output device and a control unit for controlling an output volume of an output of the acoustic voice signal by means of the at least one output device as a function of the location.

For embodiments, developments, design details and advantages of the device according to the invention, reference is made to the description relating to the relevant method features.

BRIEF DESCRIPTION OF THE SEVERAL VIEWS OF THE DRAWING

Exemplary embodiments of the invention are now explained with the aid of the drawings, in which.

DESCRIPTION OF THE INVENTION

Figure 1:
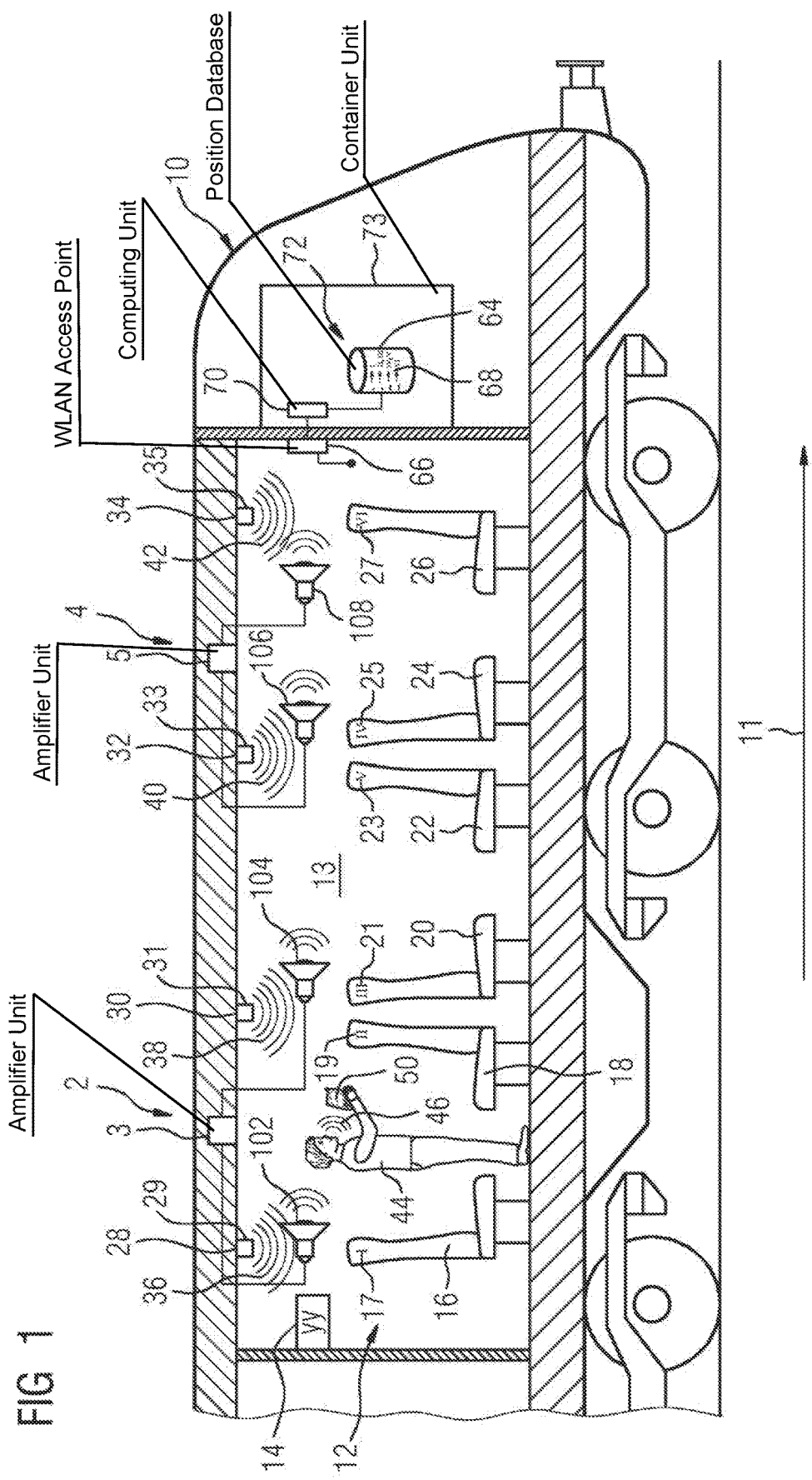
FIG. 1 shows a schematic view of a rail vehicle in a cross-sectional view according to an exemplary embodiment of an arrangement according to the invention and FIG. 2 shows a schematic design of the exemplary embodiment of the arrangement according to the invention shown in FIG. 1.

FIG. 1 shows a rail vehicle 10 in a lateral cross-sectional view. In the embodiment shown, the rail vehicle 10 is embodied as a multiple unit that is provided for the transportation of passengers. In a further embodiment, the rail vehicle 10 can be embodied as a train set consisting of a locomotive and a plurality of railway cars.

Figure 2:
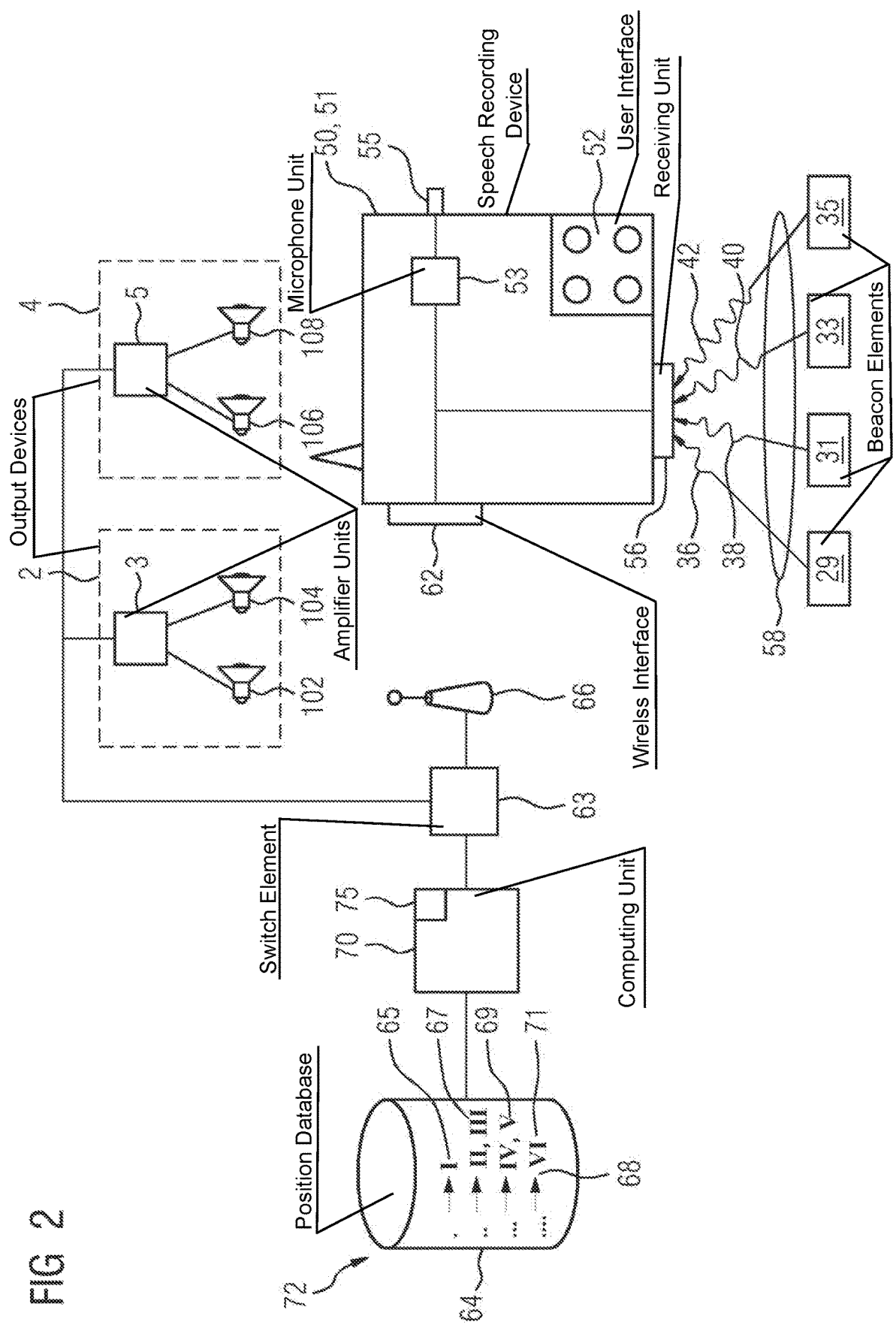

FIG. 2 shows a schematic view of the design of the arrangement and the information flow between the individual devices, units and elements in the arrangement.

The rail vehicle 10 comprises a car 12 with a car number 14. In a passenger compartment 13, the car 12 has a plurality of seats 16, 18, 20, 22, 24, 26, which each have a respective seat number 17, 19, 21, 23, 25, 27.

In a ceiling area of the passenger compartment 13, a plurality of transponder elements 28, 30, 32, 34 are arranged. The transponder elements 28, 30, 32, 34 are each embodied as active transponder elements, that is, as beacon elements 29, 31, 33, 35. The transponder elements 28, 30, 32, 34 can alternatively or additionally be embodied as passive transponder elements. The beacon elements 29, 31, 33, 35 respectively transmit an identification signal 36, 38, 40, 42 at regular time intervals.

In addition, a plurality of output devices 2, 4 are arranged in the passenger space 13. The output device 2 has two speaker units 102, 104 for the output of acoustic signals and the output device 4 has two speaker units 106, 108.

A train conductor 44 who is in the passenger compartment 13 is able when performing the method according to the invention to make an announcement, which is acoustically perceptible by all of the passengers in the rail vehicle 10. For this purpose, in a process step A, an acoustic voice signal 46 from the train conductor 44 is recorded by means of a speech-recording device 50. In the exemplary embodiment shown in FIG. 1, the acoustic voice signal 46 comprises an oral announcement made by the train conductor 44. The announcement is used, for example, to impart information to passengers who are located in the rail vehicle 10. In this way, for example, information relating to a forthcoming station that the rail vehicle 10 will call at and information relating to further travel options can be announced.

The speech-recording device 50 is embodied as a mobile terminal 51. In order to start the recording, the train conductor 44 activates a user interface 52 on the speech-recording device 50. The speech-recording device 50 comprises a microphone unit 53 with an acoustic sensor 55 for receiving the acoustic voice signal 46. The microphone unit 53 converts the acoustic voice signal 46 into an electromagnetic voice signal. The electromagnetic voice signal is transmitted to a computing unit 70 on a pathway via a wireless interface 62 of the speech-recording device 50, a WLAN access point 66 that is arranged in the passenger space 13, and a switch element 63.

In a process step B, the acoustic voice signal is output by means of the output devices 2, 4 such that all the passengers located in the passenger space 13 can perceive the acoustic voice signal that has been output.

In a process step C, the beacon elements 29, 31, 33, 35 provide a location-determination signal 58, which is made up of the identification signals 36, 38, 40, 42. The identification signals 36, 38, 40, 42 are electromagnetic signals, which each contain identification information by means of which the respective beacon-element 29, 31, 33, 35 can be identified. The respective identification information is implemented using the Bluetooth standard. The speech-recording device 50 receives the location-determination signal 58 by means of a receiving unit 56, which is embodied as a Bluetooth interface.

In a process step E, a location of the speech-recording device 50 is determined relative to the output devices 2, 4.

To this end, the location of the speech-recording device within the rail vehicle 10 is first determined. The speech-recording device 50 transmits the identification signals 36, 38, 40, 42 that it has received to a position database 64 by means of the wireless interface 62, said database being arranged within the rail vehicle 10. For this purpose, the identification signals 36, 38, 40, 42 are transmitted wirelessly to the WLAN access point 66, which has a data connection with the position database 64 via the switch element 63. Using a mapping table 68 that is stored in the position database 64, the computing unit 70, which has a data connection with the position database 64, in each case allocates to the identification signals 36, 38, 40, 42 an item of transponder location information 65, 67, 69, 71, which represents the location of the respective transponder element 28, 30, 32, 34. The transponder location information 65, 67, 69, 71 is therefore provided by the position database 64, which is designed as a data processing device 72 to provide the transponder location information 65, 67, 69, 71. The data processing device 72 is arranged in a container unit 73 for on-board supply components of the rail vehicle 10. The data processing device 72 is arranged outside the respective transponder element 65, 67, 69, 71.

The transponder location information 65 for the beacon element 29 contains, for example, a train number 74, the car number 14 and the seat number 17. The transponder location information 67 for the beacon element 31 contains, for example, the train number 74, the car number 14 and the seat numbers 19 and 21. The transponder location information 69 for the beacon element 33 contains, for example, the train number 74, the car number 14 and the seat numbers 23 and 25. The transponder location information 71 for the beacon-element 35 contains, for example, the train number 74, the car number 14 and the seat number 19 and 21. The transponder location information 69 for the beacon element 33 contains, for example, the train number 74, the car number 14 and the seat numbers 23 and 25. The transponder location information 71 for the beacon element 35 contains, for example, the train number 74, the car number 14 and the seat number 27. The transponder location information 65, 67, 69, 71 therefore indicates on which seat or on which seats, in which car and in which train a respective beacon element 29, 31, 33 or 35 is located.

For the determination of the location of the speech-recording device 50 within the rail vehicle 10 on the basis of knowledge of the transponder location information 65, 67, 69, 71, the location of the speech-recording device 50 is determined relative to the transponder elements 28, 30, 32, 34. For this purpose, the speech-recording unit 50 determines an intensity of the respective identification signal 36, 38, 40, 42. The speech-recording device 50 transmits intensity information that is representative of the respective intensity to the computing unit 70, by means of the wireless interface 62. The location of the speech-recording unit 50 relative to the transponder element 28, 30, 32, 34 is determined by means of the computation unit 70 using triangulation. For the determination of the location of the speech-recording device 50 relative to a longitudinal extent 11 of the rail vehicle 10, the reception of two identification signals, in particular of the identification signals 36 and 38, is sufficient.

The computing unit 70 uses the transponder location information 65, 67, 69, 71 and the location of the speech-recording device 50 relative to the transponder elements 28, 30, 32, 34 to determine the location of the speech-recording device 50 within the rail vehicle 10.

The computing unit 70 comprises a memory unit 75, which comprises information relating to a respective location and a respective orientation of the speakers 102, 104 or 106, 108 in the output devices 2 or 4. With its knowledge of the location of the speech-recording device 50 within the rail vehicle 10 and of the locations of the output devices 2, 4, the computing unit 70 determines the location of the speech-recording device relative to the output devices 2, 4.

In a process step F, the output volume of the output devices 2, 4 is controlled as a function of the location of the speech-recording device 50 relative to the output devices 2, 4. In particular, in a process step G, the output volume is controlled such that acoustic feedback between the output devices 2, 4 and the speech-recording device 50 is avoided.

With its knowledge of the location of the speech-recording device relative to the output devices 2, 4 and the respective orientation of the speakers 102, 104, 106, 108, the computing unit 70 determines whether feedback between the speech-recording unit 50, and one or a plurality of the output devices 2, 4 is to be expected. The one or a plurality of output devices 2, 4 that may be involved in creating feedback is (are) selected as the ambient output device (devices).

In the rail vehicle 10 shown in FIG. 1, the output device 2 is selected as an ambient output device. The speaker unit 102 of the output device 2 has an orientation in the direction of the speech-recording device 50 and is in the vicinity of the speech-recording device 50 such that, in the case of an output of the acoustic voice signal 46, feedback is to be expected. In order to avoid feedback, the computing unit 70 controls the output volume of the ambient output device 2. For example, the output volume of the output device 7 is set at zero by the ambient output device 2 being switched off.

The output device 2 has an amplifier unit 3 and the output device 4 an amplifier unit 5. The amplifier unit 3 is used to amplify the electromagnetic voice signal that is provided for the speaker units 102 and 104. The amplifier unit 5 is used to amplify the electromagnetic voice signal that is provided for the speaker units 106 and 108. The controlling of the output volume of the ambient output device 2 is carried out by the amplifier unit 3 of the ambient output device 2 being controlled. For this purpose, the computing unit 70 transmits a volume control signal to the amplifier unit 3 via the switch element 63.

The invention claimed is:

1. A method for controlling an output volume of at least one acoustic output device located in a vehicle or a rail vehicle, the method comprising the following steps:
    using a speech-recording device to record an acoustic voice signal;
    determining a location of the speech-recording device relative to the at least one output device located in the vehicle or the rail vehicle;
    carrying out the step of determining the location of the speech-recording device based on at least one location-determination signal emanating from at least one of an active or a passive transponder element and being received by the speech-recording device;
    using the at least one output device to output the acoustic voice signal; and
    controlling the output volume of the at least one output device as a function of the location of the speech-recording device.

2. The method according to claim 1, which further comprises carrying out the step of controlling the output volume in such a way that acoustic feedback between the at least one output device and the speech-recording device is avoided.

3. The method according to claim 1, wherein the speech-recording device receives the location-determination signal in the form of an electromagnetic signal using the Bluetooth standard.

4. The method according to claim 1, wherein the at least one location-determination signal emanates from at least one of the active transponder element including a beacon element or the passive transponder element including an RFID-element.

5. The method according to claim 1, which further comprises carrying out the step of determining the location of the speech-recording device based on an intensity of the at least one location-determination signal.

6. The method according to claim 1, wherein the at least one location-determination signal includes an identification signal for identifying the transponder element.

7. The method according to claim 6, which further comprises:
    using a mapping table to assign transponder location information being representative of the location of the transponder element to the identification signal; and
    determining the location of the speech-recording device by using the transponder location information.

8. The method according to claim 7, which further comprises using a data processing device disposed outside the transponder element to provide the transponder location information.

9. The method according to claim 1, which further comprises:
- based on the location of the speech-recording device, selecting at least one ambient output device out of a plurality of output devices disposed in a vicinity of the speech-recording device; and
- achieving the control of the output volume by controlling the output volume of the at least one ambient output device.

10. The method according to claim 9, wherein the plurality of output devices is disposed at a distance of less than 10 m from the speech-recording device.

11. The method according to claim 9, which further comprises achieving the control of the output volume by adjusting or switching off the output volume.

12. The method according to claim 9, which further comprises:
- providing each of the output devices with at least one respective speaker unit and at least one respective amplifier unit;
- selecting at least one ambient amplifier unit disposed in a vicinity of the speech-recording device out of a plurality of amplifier units based on the location of the speech-recording device; and
- achieving the control of the output volume by controlling an output of the at least one ambient amplifier unit.

13. The method according to claim 1, wherein the speech-recording device includes a mobile terminal.

14. An arrangement for controlling an output volume of at least one acoustic output device located in a vehicle or a rail vehicle, the arrangement comprising:
- at least one of an active or a passive transponder element emitting at least one location-determination signal;
- a speech-recording device for recording an acoustic voice signal, said speech-recording device receiving said at least one location-determination signal;
- a determination unit for determining a location of said speech-recording device relative to the at least one output device located in the vehicle or the rail vehicle based on said at least one location-determination signal; and
- a control unit for controlling an output volume of an output of the acoustic voice signal by the at least one output device as a function of the location of said speech-recording device.

* * * * *